United States Patent [19]
Lee

[11] Patent Number: 5,137,245
[45] Date of Patent: Aug. 11, 1992

[54] DEVICE FOR FASTENING ELECTRONIC COMPONENTS IN PC BOARD

[76] Inventor: Roger Lee, 2F, No. 164, Sec. 2, Fu Shin S., Rd., Taipei, Taiwan

[21] Appl. No.: 707,598

[22] Filed: May 30, 1991

[51] Int. Cl.$^5$ ............................................. A47B 97/00
[52] U.S. Cl. .................................. 248/506; 248/220.2; 361/386
[58] Field of Search ............... 298/506, 500, 510, 680, 298/544, 220.2, 224.4, 231.8, 231.9, 316.7; 24/453; 361/386, 388

[56] References Cited

U.S. PATENT DOCUMENTS

| | | | |
|---|---|---|---|
| 3,996,500 | 12/1976 | Coules | 248/500 X |
| 4,619,431 | 10/1986 | Matsui et al. | 248/500 |
| 4,813,642 | 3/1989 | Matsui | 248/500 X |
| 4,964,198 | 10/1990 | McCarthy | 361/386 X |
| 4,972,294 | 11/1990 | Moses, Jr. et al. | 361/386 |

*Primary Examiner*—Ramon O. Ramirez
*Attorney, Agent, or Firm*—Bacon & Thomas

[57] ABSTRACT

A fastening device comprised of a L-shaped base having a horizontal surface portion extending from a vertical surface portion at one end, wherein said vertical surface portion has a locating hole fastened to an electronic component by tenon-and-mortise joint; said horizontal surface portion has a pawl vertically disposed at the bottom for fastening said electronic component to a PC board and a U-shaped bumper at the front end thereof stopped at the bottom edge of said electronic component to stabilize mounting of the fastening device in said PC board. The pawl is comprised of four fastening strips vertically disposed around a circle, which fastening strips have each a hooked bottom end obliquely projecting inwards for fastening in the PC board firmly and rapidly.

2 Claims, 2 Drawing Sheets

DEVICE FOR FASTENING ELECTRONIC COMPONENTS IN PC BOARD

BACKGROUND OF THE INVENTION

The present invention relates to fastening devices and relates more particularly to a fastening device for fastening a connector or an electronic component in a PC board which can be conveniently fastened in a PC board to firmly secure a connector or an electronic component in place.

In regular PC board and electronic component assembling and processing devices must first be used to fasten electronic components in PC boards before processing is made. FIGS. 1 and 2 illustrate two different, known structures of a fastening device for fastening a connector or other electronic component in a PC board. In FIG. 1, the fastening device has a rivet hole for fastening a connector by a rivet and a pointed fastening strip at the bottom for fastening said connector to a PC board. Because the pointed fastening strip is not elastic, the location of the corresponding mounting hole in the PC board must be precisely matched. Any minor location error may cause the fastening device to be unable to secure or stably secure the connected electronic component in place. In FIG. 2, the fastening device has a split hook at the bottom for fastening in a PC board. Because the split hook is permitted to expand or contract only in transverse direction (along wider cross-section), it produces strong resisting force when it is fastened in a PC board. Therefore, it is difficult to insert the split hook in a mounting hole in relatively smaller diameter. If to insert the split hook in a mounting hole by force, the elastic property of the split hook may be deteriorated easily. Further, either structure of the aforesaid two different fastening devices is secured to an electronic component through rivet joint at a single point. This one-point binding process may cause the fastening strip or the split hook to displace relative to the electronic component to which the fastening device is attached, causing mounting problem. Further, either of the aforesaid two different fastening devices has a structure to maintain the pointed fastening strip or split hook thereof in position against resisting force when the pointed fastening strip or the split hook is inserted in a PC board.

SUMMARY OF THE INVENTION

The present invention has been accomplished to eliminate the aforesaid problems. It is therefore the main object of the present invention to provide a fastening device for fastening an electronic component in a PC board which can be firmly attached to an electronic component and conveniently stably secure said electronic component in a PC board.

According to a first aspect of the present invention, there is provided a fastening device comprised of a L-shaped base having a horizontal surface portion extending from a vertical surface portion at one end, wherein the vertical surface portion has a rivet hole and a locating hole for fastening an electronic component through rivet joint and tenon-and-mortise joint respectively to firmly secure the horizontal surface portion in position relative to said electronic component.

According to a second aspect of the present invention, the horizontal surface portion has a pawl vertically disposed at the bottom, which pawl is comprised of four fastening strips vertically disposed around a circle, which fastening strips have each a hooked bottom end obliquely projecting inwards for fastening in a PC board firmly and conveniently.

According to a third aspect of the present invention, the horizontal surface portion has a U-shaped bumper at the front end thereof stopped at the bottom edge of the base of the electronic component to firmly maintain the pawl in position when the fastening strips of the pawl are inserted in a PC board.

DETAILED DESCRIPTION OF THE PREFERRED EMBODIMENT

Figure 1:
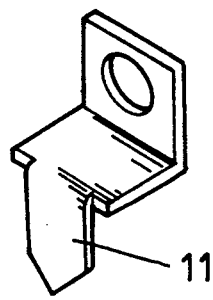
FIG. 1 illustrates a structure of fastening device according to the prior art which has a pointed fastening strip at the bottom for fastening in a PC board.
Figure 2:
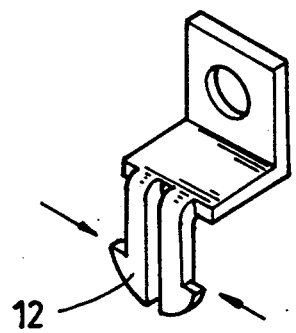
FIG. 2 illustrates another structure of fastening device according to the prior art, which has a slit hook at the bottom for fastening in a PC board.
Figure 3:
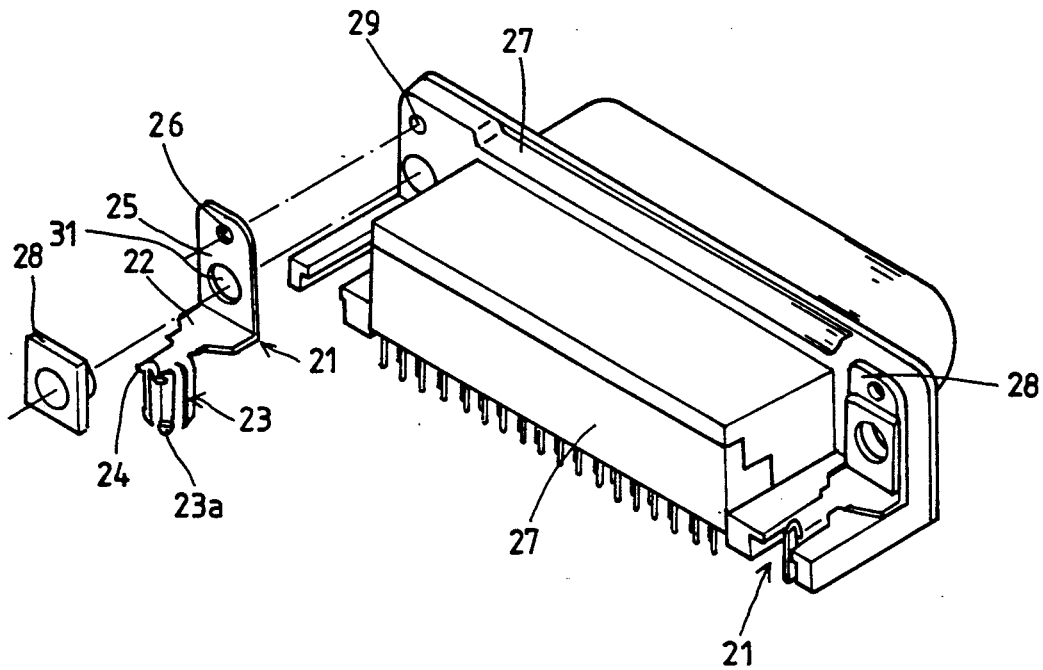
FIG. 3 is a perspective view showing the structure of the fastening device of the present invention and its use in fastening a connector.

Referring to FIG. 3, a fastening device in accordance with the present invention is generally comprised of a substantially L-shaped base 21 having a horizontal surface portion 22 extending from a vertical surface portion 25 at one end, wherein the vertical surface portion 25 has a hole 26 at an upper position and a rivet hole 31 at a lower position; the horizontal surface portion 22 has a substantially U-shaped bumper 24 at the front end thereof and a pawl 23 vertically disposed at the bottom, which pawl 23 is made of resilient material and compised of four fastening strips vertically disposed around a circle, with each strip being provided with a hooked end 23a.

Figure 4:
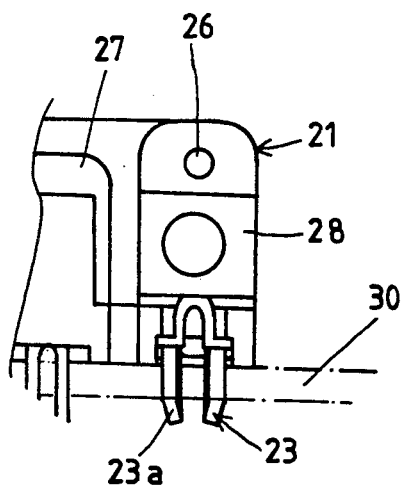
FIG. 4 is a plan view illustrating that a fastening device of the present invention is fastened in a PC board to secure a connector thereto.

Referring to FIG. 4 and seeing FIG. 3 again, when the fastening device 21 is used to fasten a connector 27 in a PC board, use a rivet 28 to fasten the fastening device 21 to the connector 27 at either end permitting the hole 26 on the vertical surface portion 25 of the fastening device 21 to be mounted on the raised portion 29 on the connector 27 at the same end, with the bumper 24 thereof to be stopped at base of the connector 27 to stably support the fastening device 21 in place. After having been secured to the connector 27, the fastening device 21 is fastened in a PC board 30 to secure the connector 27 thereto. As indicated the pawl 23 is made of resilient material and comprised of four fastening strips vertically disposed around a circle it is able to return to former shape after being squeezed inwards. Further, the four fastening strips of the pawl 23 have each a hooked bottom end for fastening. Therefore, it can be conveniently fastened in a PC board 30 to secure the connected connector in place. Because of the effect of the bumper 24 which stops against the bottom edge of the base of the connector, the pawl 23 is maintained in a vertical position when the fastening strips thereof are inserting into a mounting hole of the PC board 30 during connector mounting process.

What is claimed is:

1. A fastening device comprised of an L-shaped base having a horizontal surface portion extending from a vertical surface portion at one end, said vertical surface portion having a rivet hole for fastening an electronic component by a rivet, said horizontal surface portion having a pawl vertically disposed at the bottom for fastening said electronic component to a PC board and characterized in said horizontal surface portion having a substantially U-shaped bumper at the front end thereof stopped at the bottom edge of said electronic component; said pawl is comprised of four fastening strips vertcally disposed around a circle, said four fastening strips having each a hooked bottom end projecting obliquely inwardly.

2. The fastening device of claim 1, wherein said vertical surface portion has a locating hole vertically spaced from said rivet hole for securing to said electronic component through a tenon and mortise joint.

* * * * *